May 18, 1965 A. J. JENSEN 3,184,534

SEMICONDUCTOR DEVICE ENCLOSURE WITH WELD REINFORCING RING

Filed Nov. 24, 1961

Arthur J. Jensen
INVENTOR.

BY James O. Dixon

United States Patent Office 3,184,534
Patented May 18, 1965

3,184,534

SEMICONDUCTOR DEVICE ENCLOSURE WITH WELD REINFORCING RING

Arthur J. Jensen, Richardson, Tex., assignor to Texas Instruments Incorporated, Dallas, Tex., a corporation of Delaware Filed Nov. 24, 1961, Ser. No. 154,483
7 Claims. (Cl. 174—52)

Figure 1:
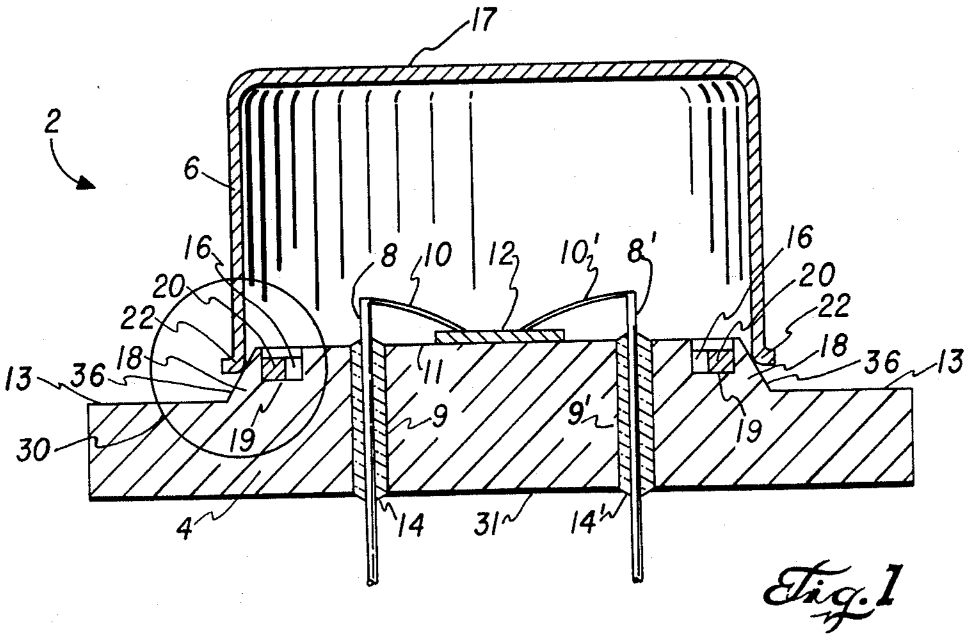

The present invention relates to a semiconductor device enclosure. More particularly, the invention relates to a semi-conductor device enclosure comprising a metallic plate member and a cylindrical can member cold welded thereto wherein the can member and the plate member form an hermetically sealed enclosure for a semiconductor device mounted therewithin.

Because of the necessity of hermetically sealing semiconductor devices within an evacuated enclosure, or an enclosure containing an atmosphere that does not contaminate or degrade the device over long periods of operation, much work has been done on perfecting ways and means for hermetically sealing the two members comprising an enclosure. Although enclosures necessitating either a glass-to-glass seal or a glass-to-metal seal are no longer difficult to produce, excellent hermetic seals of either kind being easily effected, enclosures necessitating a hermetic metal-to-metal seal frequently present problems, and are often poorer hermetic seals than either glass-to-metal or glass-to-glass seals.

An all metal enclosure over an all glass or partial glass enclosure is desirable in those cases where good heat conduction, physical strength against breakage and low mass production cost are prerequisites. For example, high power transistors generally fit into this category, a transistor being mounted on a metallic plate member with a metallic cylindrical can member positioned over the transistor and soldered or welded at its open end to the metallic plate. From the standpoint of cost and simplicity in mass producing such devices and their related enclosures, a cold welded hermetic seal between the can member and the plate member is preferred, due caution being exercised to prevent damage to the enclosed semiconductor device and to the plate member by bending or distortion as a result of the large pressures exerted during the forming of the cold welded seal.

It is therefore an object of the present invention to provide a semiconductor device enclosure comprising a metallic plate member and a cylindrical can member hermetically sealed at its open end thereto by cold welding or thermo-compression bonding, a semiconductor device being mounted within the enclosure defined by the plate member and the can member.

Another object of the invention is the provision of a metallic plate member so designed that a semiconductor device can be mounted thereon or thereabove and a cylindrical metallic can member can be hermetically cold welded thereto without damage to the device within the enclosure or distortion of the metallic plate member above or upon which the device is mounted.

Another object of the invention is to provide a cold welded, hermetically sealed semiconductor device enclosure having great physical strength and excellent heat conducting properties.

Figure 2:
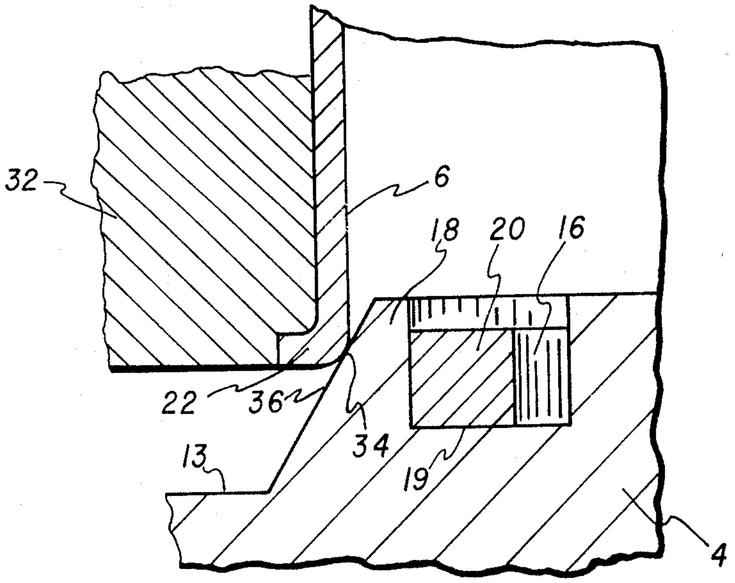

Other objects, features and advantages will become apparent from the following detailed description of the preferred embodiment of the invention when taken in conjunction with the appended claims and the attached drawing wherein like reference numerals refer to like parts and in which:

FIGURE 1 is a sectional view in elevation of a semiconductor device header and can enclosure embodying the principal features of the invention; and FIGURE 2 is an enlarged sectional view in elevation of the portion of the structure shown in FIGURE 1 designated generally by the reference numeral 30.

Referring to FIGURE 1, the numeral 2 generally designates a semiconductor device enclosure including a header 4 and a can 6 hermetically sealed thereto. More specifically, there is shown a transistor header 4, preferably made of copper but may be made of any other suitable metal, having a semiconductor device 12 mounted in the center portion 11 thereof, the semiconductor device being a transistor, for example, of any desired type or configuration. (The semiconductor device may be mounted in any manner desired and does not necessarily have to be mounted on the central raised portion of the header member.) Electrical lead wires 8 and 8' pass through holes 9 and 9', respectively, in the header and are hermetically sealed therein by fused glass 14 and 14', respectively. Electrical connections 10 and 10' are made between two of the electrodes of the device 12 and the lead wires 8 and 8', respectively. An electrical connection to a third electrode of the device is made at the interface between the device and the header 4. The header is constructed to have a raised central portion 11 and a lower surrounding portion 13. At the periphery of the raised central portion 11 is an annular slot 19 encircling said central portion. A narrow wall 18 having an inwardly slanting outer side 36 separates the lower outer portion 13 of the header from the annular slot 19. A metal ring 20, preferably of steel or of any other suitable metal or alloy, is press-fitted into the outer corner portion of the annular slot 19 in such fashion that the dimensions of the ring insure a snug fit against the outer wall of the slot. After the ring is inserted, a small gap 16 is left between the steel ring 20 and the inner wall of the annular slot 19, the inner diameter of the ring being greater than the inner diameter of the annular slot.

A metal can 6, preferably made of copper clad steel although it may be made of any other suitable metal, is hermetically cold welded to the header 4 at the slanted outer side 36 of the wall 18. The can is a circular member matching the dimensions of the header, has a closed end 17 and a flared lip 22 at its open end to insure a smooth fit against the header.

To more fully describe the hermetic seal between the can 6 and the header 4, reference is had to FIGURE 2, which is an enlarged elevational view in section of the portion of the structure of FIGURE 1 enclosed by the circle 30. The can 6 with flared end 22 is of such circular dimension that, when positioned to rest on the slanted side 36 of the wall 18, the flared end will contact the slanted side at a height between the top of the wall 18 and the bottom of the annular slot 19. Before positioning the can on the header, the can is inserted in a metal die 32 (only partially shown) so that the flared portion 22 is approximately flush with the bottom of the die. The die is then manipulated to position the can 6 on top of the header as aforedescribed and as shown in FIGURE 2. Simultaneously, the header 4 and can 6 are pressed together with a large downward pressure (usually about 30,000–40,000 p.s.i.) to form a cold weld between the flared end 22 of the can and the slanted outer side 36 of the wall 18, the applied pressure causing a lamina flow between the parts. (Although the hermetic seal is described as being effected by cold welding, some heat is generated as a result of the applied pressure. Moreover, it should be understood that external heat can be applied simultaneously with the externally applied pressure, thus effecting a thermo-compression bond.) As the wall tends to bend inward from the applied downward pressure, the steel ring 20 exerts a pressure outwardly as a result of the inward tension thereon. The dimension of the ring 20 and slot 19 are such that a cold weld is effected between the can and the header without the inner diameter of the ring ever touching, or exerting substantial pressure on, the inner wall of the annular slot. The can 6 remains substantially intact, as does the wall 18, since the can is constrained by the die 32 and the wall is restrained by the ring 20. Thus no deformation of the central portion of the header results, and the semiconductor device 12 mounted thereon is not subjected to detrimental and destructive stresses. Moreover, the bottom side 31 of the header remains flat and is not deformed by the pressures and stresses required to effect the hermetic seal.

It is to be understood that the form of my invention, herein shown and described, is to be taken as a preferred example of the same, and that various changes in the shape, size and arrangement of parts may be resorted to without departing from the spirit and scope of the invention as defined by the appended claims.

What is claimed is:

1. A semiconductor device enclosure comprising a metallic plate having a raised solid platform thereon, a cylindrical can open at one end, said open end being hermetically sealed to said metallic plate, and a semiconductor device mounted within the enclosure upon said platform, said raised portion having a wall slanting inwardly from bottom to top and having a concentric annular slot near its periphery, a resilient metallic ring having an internal diameter greater than the internal diameter of said annular slot, said ring being press-fitted in said slot in snug relation to the outer wall thereof, said cylindrical can being hermetically sealed at its open end to the slanted wall of said raised platform, said ring exerting an outward pressure on the outer wall of said slot in response to inward pressure applied to the wall of said raised platform during the sealing of said can to said plate.

2. The enclosure as defined in claim 1 wherein the open end of said can terminates in an outwardly flared lip.

3. The enclosure as defined in claim 1 wherein said hermetic seal is a thermo-compression bond.

4. A semiconductor device enclosure comprising a metallic plate having a raised solid platform thereon, a cylindrical can open at one end, said open end being hermetically sealed to said metallic plate, and a semiconductor device mounted within the enclosure upon said platform, said raised platform having a wall inwardly slanted from bottom to top and having a concentric annular slot near its periphery, a resilient metallic ring having an internal diameter greater than the internal diameter of said annular slot, said ring being press-fitted in said slot in snug relation to the outer wall thereof, and said cylindrical can being cold-welded at its open end to the wall of said raised portion, said ring exerting an outward pressure on the outer wall of said slot in response to inward pressure applied to the wall of said raised platform during the sealing of said can to said plate.

5. The enclosure as defined in claim 4 wherein said can is welded to said slanted wall at a location approximately opposite to said metallic ring.

6. The enclosure as defined in claim 4 wherein said metallic ring is comprised of steel.

7. The enclosure as defined in claim 4 wherein said metallic ring is comprised of steel and said metallic plate is comprised of copper.

References Cited by the Examiner

UNITED STATES PATENTS

| | | | |
|---|---|---|---|
| 2,941,688 | 6/60 | Chamberlin et al. | 220—2.3 |
| 3,024,519 | 3/62 | Leinkram et al. | 317—234 X |
| 3,058,209 | 10/62 | Nijhuis et al. | 29—470.1 |

DARRELL L. CLAY, *Acting Primary Examiner.*

JOHN P. WILDMAN, *Examiner.*